United States Patent [19]

Chu et al.

[11] 4,317,680
[45] Mar. 2, 1982

[54] DIFFUSION SOURCE AND METHOD OF PREPARING

[75] Inventors: Chang K. Chu, Export; George W. Vomish, Ruffsdale, both of Pa.

[73] Assignee: Westinghouse Electric Corp., Pittsburgh, Pa.

[21] Appl. No.: 202,552

[22] Filed: Oct. 31, 1980

[51] Int. Cl.³ ............................................. C22C 28/00
[52] U.S. Cl. ..................................... 75/134 S; 75/251
[58] Field of Search ............................. 75/134 S, 251

[56] References Cited
U.S. PATENT DOCUMENTS
4,169,727 10/1979 Morgan .............................. 75/134 S Primary Examiner—R. Dean
Attorney, Agent, or Firm—C. L. Menzemer

[57] ABSTRACT

The present invention is directed to a diffusion source for establishing a p-type conductivity region in a semiconductor device and to a method for preparing such diffusion source. The diffusion source consists of pure silicon powder diffused with a p-type impurity.

10 Claims, 1 Drawing Figure

U.S. Patent     Mar. 2, 1982     4,317,680
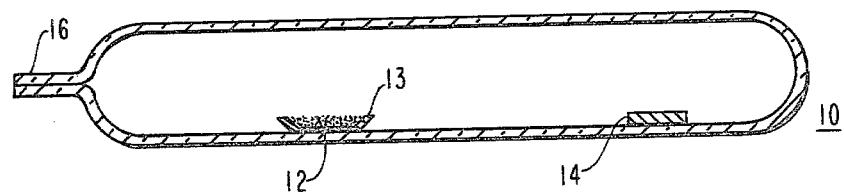

DIFFUSION SOURCE AND METHOD OF PREPARING

BACKGROUND OF THE INVENTION

1. Field of the Invention

The present invention is generally in the field of semiconductor device preparation and is specifically directed to a p-type diffusion source and to a method of preparing the source.

2. Description of Prior Art

The formation of p-type regions in bodies of semiconductors from a gaseous diffusion source is well known. The use of a solid diffusion source is also well known.

SUMMARY OF THE INVENTION

The present invention is directed to a diffusion source for introducing doping impurities into a body of semiconductor material, said source consisting of a quantity of pure silicon powder and a quantity of at least one p-type doping agent selected from the group consisting of a gallium, boron and aluminum which has been diffused into said silicon powder.

The diffusion source is prepared by disposing a predetermined amount of pure silicon in powder form and a predetermined amount of at least one doping impurity selected from the group consisting of gallium, boron, and aluminum in a quartz tube, sealing the tube under vacuum and heating said tube for a predetermined time at a predetermined temperature, whereby, said at least one doping impurity diffuses into said silicon powder.

BRIEF DESCRIPTION OF THE DRAWING

For a better understanding of the present invention reference should be had to the following detailed description and drawing in which:

FIG. 1 is a side view of a sealed quartz tube containing silicon powder and a doping impurity in practicing the teachings of this invention.

DESCRIPTION OF THE PREFERRED EMBODIMENT

With reference to FIG. 1, there is shown a quartz tube 10.

A predetermined quantity of high purity silicon powder 12 in a silicon cradle 13 is disposed in the tube 10. The powder 12 is 99.9999% silicon and has a particle size of approximately 50 microns. Silicon powder that will pass through from 100 to 300 mesh screeen has been found satisfactory.

A quantity of a doping metal or a doping metal compound 14 is also disposed in the tube 10. The metal should have a purity of from 99.9999 to 99.99999 and may be a metal selected from the group consisting of gallium, aluminum or boron. In addition, $B_2O_3$ boric oxide may be used in place of pure boron. These are p-type doping agents.

A vacuum of at least $10^{-5}$ Torr is established in the tube 10 and the tube is sealed off at 16.

The tube 10 is then placed in a furnace and heated for a predetermined time at a predetermined temperature, whereby, the p-type doping metal is gasified and diffused into the silicon powder 12.

It will be understood that the time and temperature at which the heating is carried out depends upon the desired concentration of doping metal in the silicon powder.

Specifically, 6 grams of 99.9999% pure 50 ohm-cm n-type silicon powder having an average particle size of 50 microns was disposed in two silicon cradles, 3 grams in each cradle, in a quartz tube of the type shown in FIG. 1 together with approximately 50 milligrams of 99% pure $B_2O_3$. A 40 ohm-cm n-type silicon wafer was buried in the silicon powder in each cradle.

The quartz tube was sealed off under a vacuum of $10^{-5}$ Torr and heated for 30 hours at 1100° C.

The two wafers were found to have a p-type conductivity with a surface concentration of $4 \times 10^{19}$ atoms per $cm^3$.

The silicon powder was converted to a p-type conductivity with a doping concentration of $4 \times 10^{19}$ atoms per $cm^3$.

In another run, 12 grams of 300 mesh n-type silicon powder having a resistivity of 50 ohm-cm and of 99.999% purity was disposed in each of two cradles. Each cradle also contained 25 n-type silicon wafers having a 35 ohm-cm n-type resistivity. The wafers were completely covered by the silicon powder.

The cradles were placed in a quartz tube with two gallium pellets each of which weighed 200 milligrams.

The quartz tube was sealed off under a vacuum of $10^{-5}$ Torr.

The tube was then heated for 30 hours at 1100° C.

The gallium powder was doped p-type with a concentration of $4 \times 10^{-}$ atoms per cc. The wafers had a V/I ratio of 3 to 3.5 and a p-type surface concentration of $4 \times 10^{-}$ atoms per cc.

One hundred milligrams of the gallium-doped silicon powder thus prepared was disposed in two cradles, 50 milligrams in each cradle, surrounding twenty silicon wafers in each cradle of n-type conductivity having a doping concentration of 35 ohm-cm.

The cradles were disposed in a quartz tube which was sealed off under a vacuum of $10^{-5}$ Torr. The tube was heated for 3 hours at 1100° C.

The wafers thus doped had a V/I ratio of 37 to 38 and were doped p-type to a surface concentration of $7.5 \times 10^{16}$ atoms per cc.

The above diffusion was repeated with another 100 milligrams of powder and wafer having a resistivity of 35 ohm-cm. The heating was carried out for 8 hours at 1200° C. The wafers had a V/I ratio of 25 with a p-type surface concentration of $1.6 \times 10^{17}$ atoms per cc.

Equally successful diffusions were carried out using aluminum pellets.

In addition, wafers were diffused using mixtures of boron and gallium, aluminum and boron and gallium and aluminum-doped silicon powders as a diffusion source.

We claim as our invention:

1. A diffusion source for introducing doping impurities into a body of semiconductor material, said source consisting of a quantity of pure silicon powder and a quantity of at least one p-type doping agent selected from the group consisting of gallium, boron and aluminum diffused into said silicon powder.

2. The diffusion source of claim 1 in which the silicon powder is 99.999% pure silicon and has a mesh size of from 100 to 300 mesh.

3. The diffusion source of claim 1 in which the silicon powder is 99.999% pure silicon and has an average particle size of 50 microns.

4. The diffusion source of claim 2 in which the doping agent is gallium.

5. The diffusion source of claim 2 in which the doping agent is boron.

6. The diffusion source of claim 2 in which the doping agent is aluminum.

7. A method for preparing a diffusion source suitable for use in introducing a doping impurity into a body of semiconductor material comprising:
   (1) disposing a predetermined amount of pure silicon powder and a predetermined amount of at least one doping impurity selected from the group consisting of gallium, boron and aluminum in a quartz tube,
   (2) establishing a vacuum in said tube,
   (3) sealing said tube under said vacuum,
   (4) heating said tube for a predetermined time at a predetermined temperature, whereby, said at least one doping impurity diffuses into said silicon powder.

8. The method of claim 7 in which the silicon powder is 99.999% silicon and has a mesh size of from 100 mesh to 300 mesh.

9. The method of claim 8 in which the vacuum is at least $10^{-5}$ Torr.

10. The method of claim 9 in which the predetermined temperature is 1100° C. and the time is from 15 to 17 hours.

* * * * *